United States Patent [19]
Hirasawa

[11] Patent Number: 6,078,545
[45] Date of Patent: Jun. 20, 2000

[54] DATA TRANSFER CIRCUIT

[75] Inventor: Masayuki Hirasawa, Tokyo, Japan

[73] Assignee: Oki Electric Industry Co., Ltd., Tokyo, Japan

[21] Appl. No.: 08/995,520

[22] Filed: Dec. 22, 1997
(Under 37 CFR 1.47)

[30] Foreign Application Priority Data

Dec. 26, 1996 [JP] Japan ..................................... 8-347964

[51] Int. Cl.[7] ...................................................... G11C 8/00
[52] U.S. Cl. ................................. 365/230.08; 365/230.09
[58] Field of Search ........................ 365/230.08, 230.09; 364/200; 395/425, 849, 871, 725

[56] References Cited

U.S. PATENT DOCUMENTS

| | | | |
|---|---|---|---|
| 4,075,691 | 2/1978 | Davis et al. | 364/200 |
| 4,442,485 | 4/1984 | Ota et al. | 364/200 |
| 4,761,735 | 8/1988 | Amy | 364/200 |
| 5,155,853 | 10/1992 | Mitsuhira et al. | 395/725 |
| 5,297,242 | 3/1994 | Miki | 395/425 |
| 5,497,501 | 3/1996 | Kohzono et al. | 395/849 |
| 5,579,531 | 11/1996 | Sugita | 395/871 |

FOREIGN PATENT DOCUMENTS 3-211687 9/1991 Japan .

*Primary Examiner*—David Nelms
*Assistant Examiner*—David Lam
*Attorney, Agent, or Firm*—Jones Volentine, LLP

[57] ABSTRACT

A data transfer circuit making it possible to enhance the operational efficiency of a CPU, decrease the burden imposed to software, and reduce the scale of hardware.

The data transfer circuit 10 is provided with a latch circuit 11 for latching signals EA, EB, EC indicating termination of the operation of a peripheral function portion, an operation result register 12 for storing operation results, an exclusive pointing register 13 designating a memory address for storing the contents of the operation result register 12 to a RAM, a selector 14 for selecting the exclusive pointing register 13 in response to the operation terminate signal EA, EB, EC, a selector 15 for selecting the operation result register 12 in response to the operation terminate signal EA, EB, EC, an OR gate 16 receiving the output of the latch circuit 11, a selector 17 for selecting a RAM address bus or the output signal from the selector 14, selectors 18, 19 for selecting the output signal, and a RAM 20.

20 Claims, 5 Drawing Sheets

DATA TRANSFER CIRCUIT

BACKGROUND OF THE INVENTION

This invention relates to a data transfer circuit, more particularly to a data transfer circuit performing electronic data transfer which is applicable to a microcomputer system and a microprocessor system including a central processing unit (CPU), peripheral I/O functions, memories for storing data, etc.

The microcomputer includes various peripheral I/O functions as interfaces for connecting peripheral devices for use in input-output of electronic data, and operates to transfer various electronic data among CPU, peripheral I/O functions, and memories through the data transfer circuit.

Figure 5:
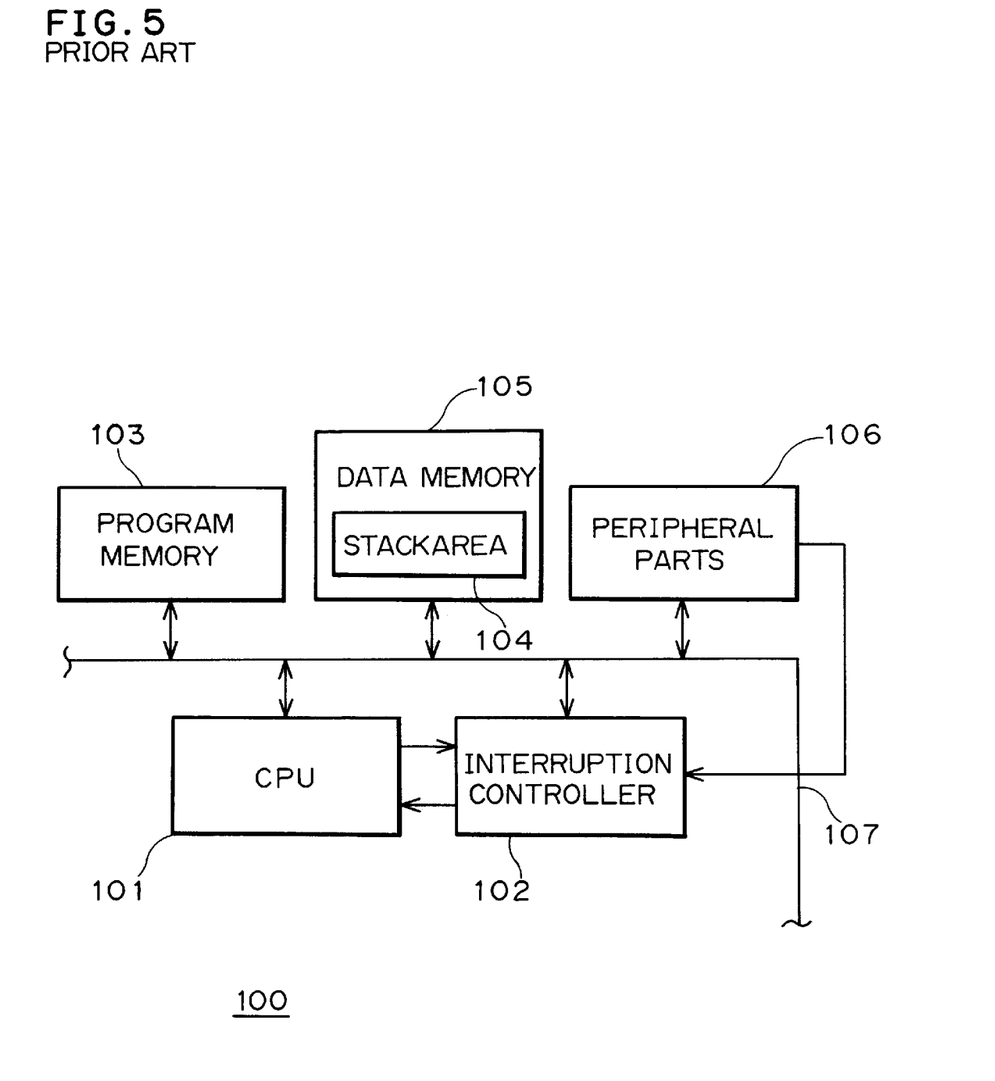
FIG. 5 is a block diagram showing the constitution of a prior art data transfer circuit.

The JP/A/3-211687 discloses such a conventional data transfer circuit of this kind as shown in FIG. 5 attached hereto. In this figure, a data transfer circuit 100 is arranged including a CPU 101, an interrupt control portion 102, a program memory 103, a data memory 105 including a stack area 104, peripheral parts 106, a data bus 107, etc.

In this arrangement, when a certain processing is finished in the peripheral parts 106, this parts 106 outputs an interrupt signal to the interrupt control portion 102. At this time, if there is a state permitting the interrupt, the interrupt control portion 102 outputs an interrupt request signal to the CPU 101. When the CPU 101 receives this interrupt request signal, it interrupts execution of the current program, and has the current program address and various registers such as an arithmetic register, a control register, and a state register saved in the stack area 104. Then, the interrupt processing program is executed.

However, in case of transferring the operation result accomplished by the peripheral parts 106 with the interrupt processing by using the prior art data transfer circuit 100 like the above, it is inevitably required to save the program address indicating the execution state of the current main program and various registers before executing the interrupt processing program, and also to return all the above saved to their original state after terminating the interrupt processing program. furthermore, as a matter of course, the main program can not help suspending execution thereof during the interrupt processing, so that if the number of peripheral parts is increased and it is frequently requested to transfer the operation results accomplished by the peripheral parts, the operational efficiency of the CPU is naturally decreased. Especially, in case the peripheral parts have to continuously deal with a large amount of data, in order to storing the preprocessed results, it is required to execute the interrupt processing program so many times as well as to additionally provide a plurality of saving registers, thus the burden of the software and the hardware being increased. This is the problem to be improved or obviated.

SUMMARY OF THE INVENTION

Accordingly, an object of the invention is to provide a data transfer circuit capable of enhancing the operational efficiency of the CPU, reducing the burden imposed on the software, and making the scale of the hardware smaller.

Another object of the invention is to provide a novel and improved data transfer circuit in which the operational efficiency of the CPU can be enhanced by decreasing the frequency of suspending the main program execution because of the interrupt processing and other reasons.

Still another object of the invention is to provide a novel and improved data transfer circuit in which access to the memory of the peripheral device can be gained on the hardware basis, so that the access control program can be eliminated, thereby enabling the burden imposed on the software to be decreased.

Still another object of the invention is to provide a novel and improved data transfer circuit wherein even in case a large amount of data are frequently exchanged between the peripheral devices and the memory, it can be dealt with the minimum number of registers, thereby enabling the hardware resources to be cut down.

Still another object of the invention is to provide a novel and improved data transfer circuit in which a series of operation between the peripheral device and the memory can be dealt with a single interrupt processing, thereby enhancing the operational efficiency of the CPU and efficiently processing a large amount of data.

In order to solve the problem and to achieve the above-mentioned objects, according to the first aspect of the invention, there is provided a data transfer circuit which performs data transmission between a memory for storing data and peripheral function portions for processing the peripheral functions of a processor having access to the above memory, and the data transfer circuit includes a pointing register which is exclusively used for a defined peripheral function portion to designate a memory address for storing the contents of the operation result accomplished by the above defined peripheral function portion.

Furthermore, according to the second aspect of the invention, there is provided a data transfer circuit which performs data transmission between a memory for storing data and peripheral function portions for processing the peripheral functions of a processor having access to the above memory, and the data transfer circuit includes a pointing register which is exclusively used for a defined peripheral function portion to designate the leading address of the output data stored in the above memory.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

PREFERRED EMBODIMENT OF INVENTION

Figure 1:
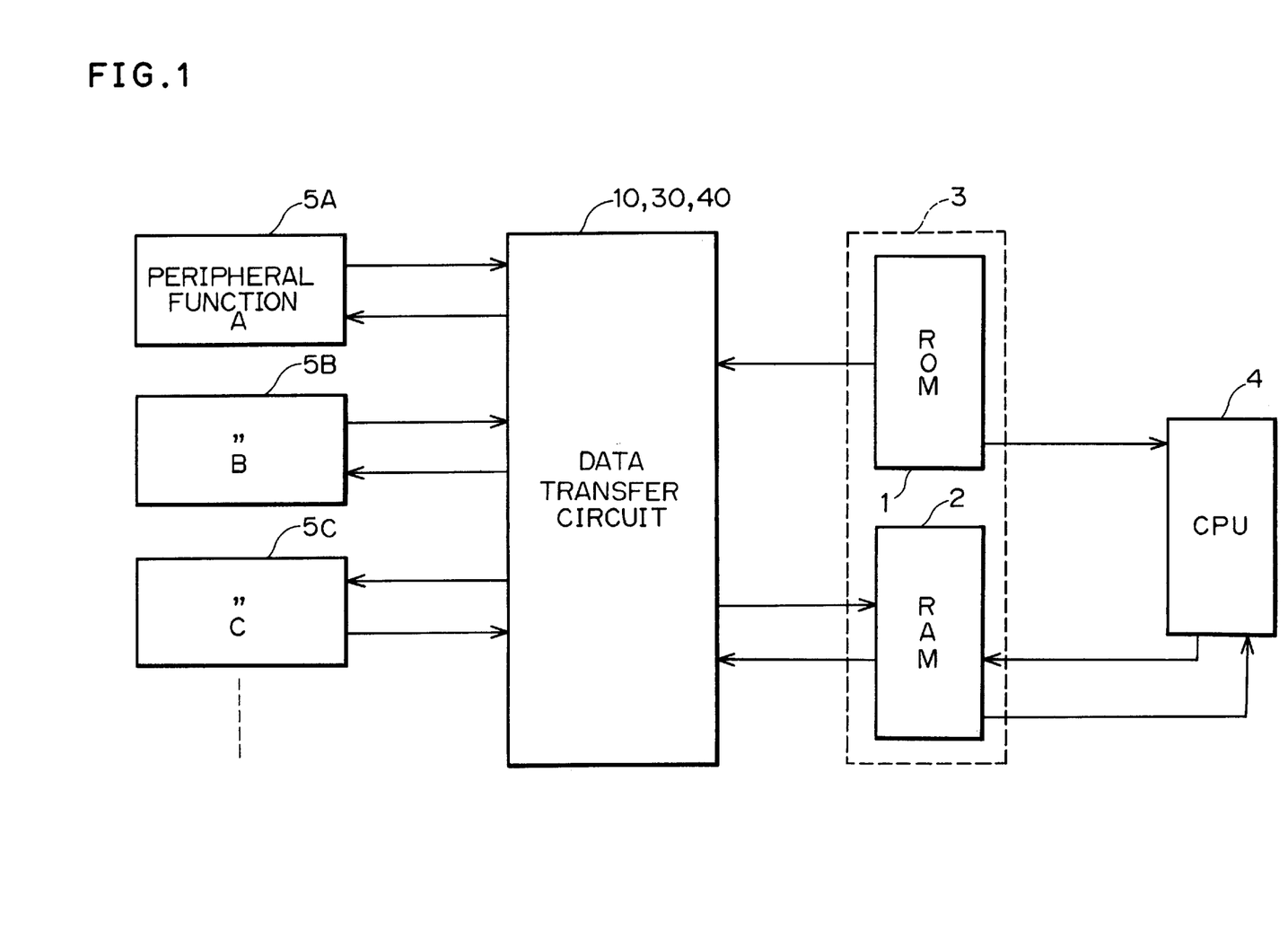
FIG. 1 is a schematic block diagram showing the constitution of a data transfer circuit according to the invention.

As shown in FIG. 1, data transfer circuits 10, 30, 40 according to the invention are employed in a data processing environment in which there are provided a memory 3 including a read-only memory (ROM) 1 and a random access memory (RAM) 2, a processor 4 such as the CPU which gains access to the memory 3, and a plurality of peripheral function portions 5A, 5B, 5C, . . . These circuits 10, 30, 40 are disposed between the above peripheral functions 5A, 5B, 5C, . . . , and the memory 3 to efficiently perform the transfer of data.

Figure 2:
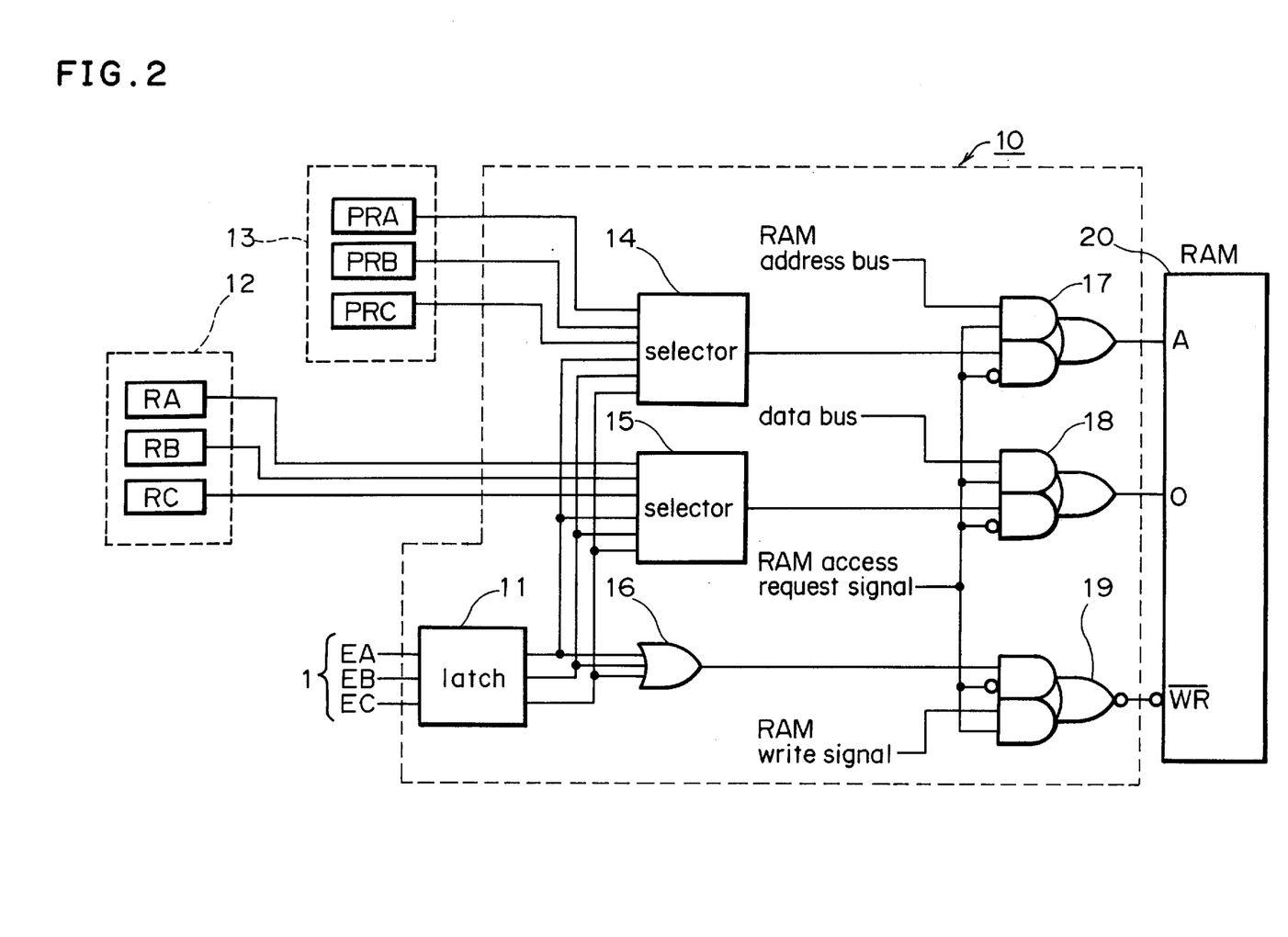
FIG. 2 is a circuit diagram showing the constitution of a data transfer circuit according to the first embodiment of the invention.

FIG. 2 is a block diagram showing the arrangement of the data transfer circuit according to the first embodiment of the invention. In the example shown in this figure, it is assumed that the data transfer circuit 10 is applied to the case where there are provided three peripheral function portions A, B, and C.

In the figure, the data transfer circuit 10 includes a latch circuit 11 which latches signals EA, EB, EC, of which each represents termination of the operation in a defined peripheral function, an operation result register portion 12 consisting of registers RA, RB, RC, of which each corresponds to a defined peripheral function and stores the operation result accomplished thereby, and a pointing register portion 13 consists of pointing registers PRA, PRB, PRC, of which each corresponds to a defined peripheral function and designates an address in a random access memory (RAM) to which the contents of the operation result register 12 are to be stored. Here, in order to simplify the following description and the recitation of claims, the register or pointing register which corresponds to a defined peripheral function or a defined peripheral function portion will be simply referred to as exclusive register or exclusive pointing register hereinafter. A selector 14 selects the exclusive pointing register 13 which is latched in response to the signal EA, EB, or EC as generated upon termination of the operation in the defined peripheral function portion. On one hand, a selector 15 selects the operation result register 12 RA, RB, RC corresponding to the peripheral function portion which is latched in response to the signal EA, EB, or EC as generated upon termination of the operation in the defined peripheral function portion. In this case, the output signal of the latch circuit 11 is transmitted to a selector 19 through an OR gate 16. A selector 17 selects a RAM address bus or the output signal of the selector 14 based on a RAM access request signal. A selector 18 selects the data bus or the output signal from the selector 15 based on the RAM access request signal. The selector 19 selects a RAM write signal or the output signal from the OR gate 16 based on the RAM access request signal. Outputs from selectors 17, 18, and 19 are respectively connected with the corresponding terminals of the RAM 20, which are an address terminal (A), a data input terminal (O), and a signal write terminal /WR thereof.

The above-mentioned exclusive pointing register 13 is arranged as a counter circuit.

The operation of the data transfer circuit 10 as arranged in the above will now be explained in the following. In this case, it is assumed that the peripheral function A is continuously operated.

When the first round operation of the peripheral function A is completed, the result of this operation is stored in the operation result register RA, the signal EA indicating termination of the operation of the peripheral function A is outputted, and then, the peripheral function A enters into its second round operation. When the signal EA indicating termination of the operation of the peripheral function is held by the latch circuit 11, selectors 14, 15 select the exclusive pointing register PRA and the operation result register RA corresponding to the peripheral function A, and then, the OR gate 16 is set. In this exclusive pointing register PRA, there is set in advance a leading address for storing the contents of the operation result register RA to the peripheral function A to the RAM 20.

At this stage, if the main program makes no RAM access request, the exclusive pointing register PRA for the address of the RAM 20 and the operation result register RA for the write data are selected by selectors 17, 18, 19, thereby the contents of the operation result register RA being written in the RAM 20.

When this write operation is over, the latch circuit 11 is reset and the exclusive pointing register PRA is incremented and waits for termination of the subsequent operation.

As will be appreciated from the above-mentioned operation, the transfer of the contents of the operation result register 12 to the RAM 20 is not carried out on the basis of the software demanding the interrupt operation, but is carried out perfectly on the hardware basis. As described above, with the data transfer circuit 10 according to the first embodiment of the invention, all the accesses to the RAM are performed on the hardware basis. Consequently, the following advantageous effects will be obtained if the above data transfer circuit is applied to the microcomputer or microprocessor having a peripheral function, the operation result of which is required to be frequently renewed, or including so many peripheral functions.

Namely, the main program can be executed without being suspended by the interrupt request or the like, thus the operational efficiency of the CPU being enhanced.

Also, there is no need to prepare such a program as simply transfers the operation result accomplished by the peripheral device to a RAM, Furthermore, in general, in case the operation result accomplished by the peripheral function has to be frequently renewed, many operation result registers has to be prepared in compliance with such need. With the data transfer circuit 10 according to the invention, however, there is no need to increase the number of the operation result registers, thus enabling the scale of hardware resource to be reduced.

Still further, even in case of simply transferring the operation result accomplished by the peripheral device to the RAM, such transfer can be performed without executing any interrupt operation, so that there is no need for the current program address and other registers to be saved in the stack area as has been done so far, and the significant processing can be speedily carried out giving the priority thereto.

Figure 3:
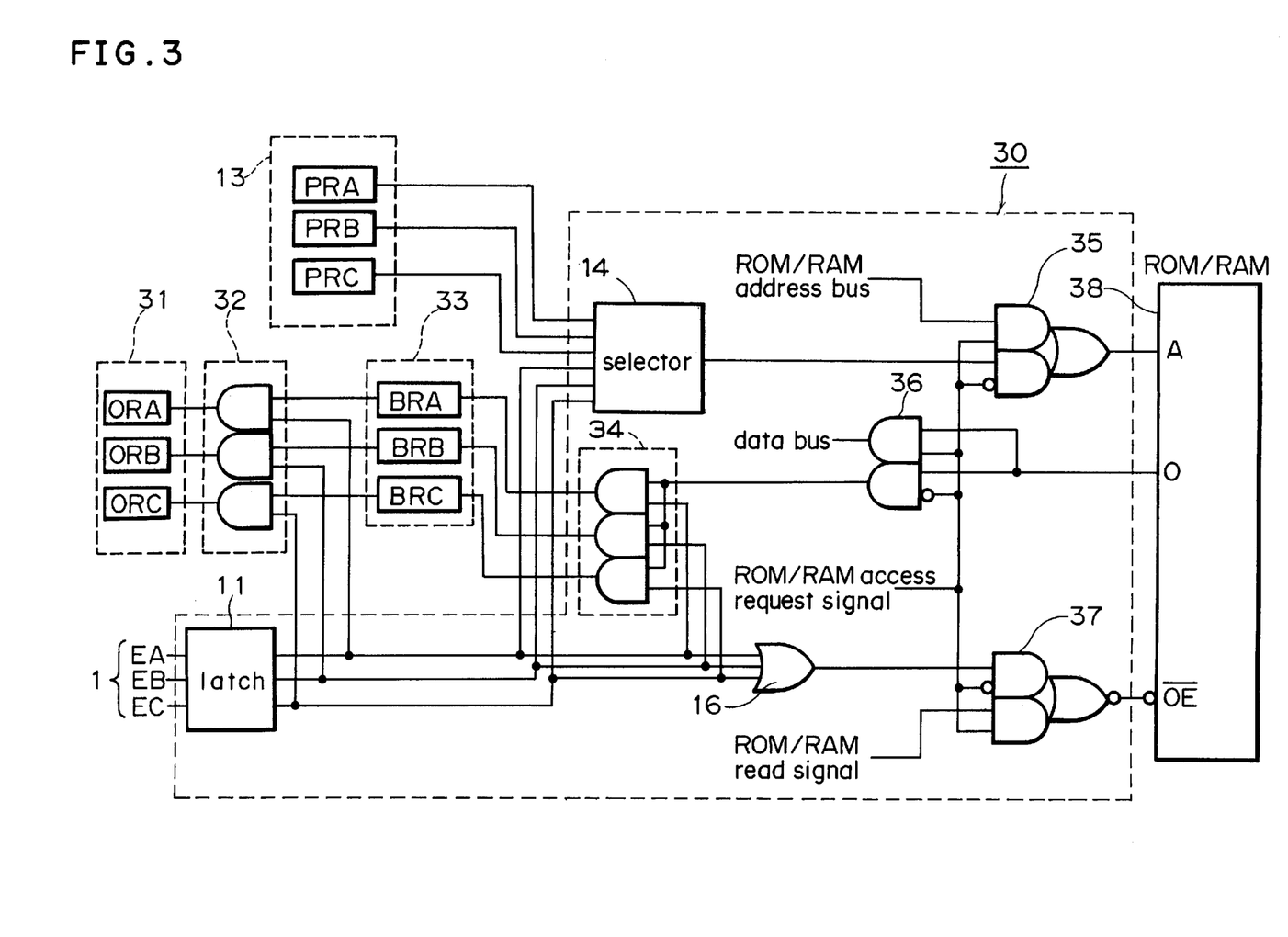
FIG. 3 is a circuit diagram showing the constitution of a data transfer circuit according to the second embodiment of the invention.

FIG. 3 is a circuit diagram showing the arrangement of a data transfer circuit according to the second embodiment of the invention. In the example shown in this figure, it is assumed that the data transfer circuit is applied to the case where there are provided three peripheral function portions A, B, and C. In the explanation of the data transfer circuit according to this second embodiment, in order to avoid the repetitive description over the same components as those of the data transfer circuit shown in FIG. 1, the like components is designated by the like reference numerals.

Referring to FIG. 3, the data transfer circuit 30 is provided with an output register 31 consisting of output registers ORA, ORB, ORC, of which each stores the output data to be outputted to the peripheral functions (not shown), and a buffer register 33 consisting of buffer registers BRA, BRB, BRC, of which each stores the subsequent output data. A latch circuit 11 latches signals EA, EB, EC indicating termination of the operation by the peripheral function portion. An AND gate 32 loads the output from the buffer register 33 to the output register 31 in response to the output from the latch circuit 11. A selector 34 selects the buffer register 33 based on the output from the latch circuit 11. In this embodiment, an exclusive pointing register 13 indicates the leading address of the ROM or RAM 38 storing the output data after the subsequent output data. The selector 14 selects the exclusive pointing register 13 in response to the generated signal EA, EB, or EC indicating termination of the operation. A selector 35 selects the ROM or RAM address bus or the output of the selector 14 based on the ROM or RAM access request signal. A selector 36 selects, in response to the ROM or RAM access request signal, whether the output data from ROM or RAM is to be directed to the data bus or the selector 34. A selector 37 selects, in response to the ROM or RAM access request signal, the read signal to ROM or RAM or the output signal from an OR gate 16 to which the output of the latch circuit 11 is inputted. Selectors 35, 36, 37 are respectively connected with corresponding terminals of the ROM or RAM 38, that is, the output of the selector 35 is connected with the address terminal (A) of the same, the input of the selector 36 is connected with the data output terminal (O) of the same and the output of the selector 37 is connected with the output enable terminal (/OE), respectively.

In this embodiment, the exclusive pointing register 13 is used for designating the leading address of the ROM or RAM 38 which stores the output data after the subsequent data and is arranged in the form of a counter circuit.

The operation of the data transfer circuit 30 as arranged in the above will now be explained in the following. In this case, it is assumed that the peripheral function A is continuously operated to output data.

When the peripheral function A outputs the data of the output register ORA in its first round data output operation, the signal EA indicating termination of the operation is outputted.

When this signal EA is held by the latch circuit 11, the exclusive pointing register PRA of the peripheral function A is selected by the selector 14, the OR gate 16 is set, and then, the contents of the buffer register BRA are loaded to the output register ORA through the AND gate 32.

At this time, the second output data is stored in this buffer register BRA. In the exclusive pointing register PRA is set in advance the leading address of the ROM or RAM 38 storing the third output data and subsequent ones thereafter.

At this stage, if the main program makes no RAM access request, the data of which the address is the exclusive pointing register PRA, are outputted from the ROM or RAM 38 and are written to the corresponding buffer register 33 (i.e. BRA in this case) through the selector 36.

When write operation is over, the latch circuit 11 is reset, and the exclusive pointing register PRA is incremented and waits for termination of the subsequent operation.

In the above-mentioned operation, the transfer of the contents of the ROM or RAM 38 to the output register 31 is not carried out on the basis of the software demanding the interrupt operation, but is carried out perfectly on the basis of the hardware. As described above, all the accesses to the RAM are performed on the hardware basis in the data transfer circuit 30 according to the second embodiment of the invention. Accordingly, the following advantageous effects will be obtained if the above data transfer circuit is applied to the microcomputer or microprocessor having a peripheral function which operates to continuously output a large amount of data or including so many peripheral functions.

Namely, The main program can be executed without being suspended by the interrupt request or the like, thus the operational efficiency of the CPU being enhanced.

Furthermore, there is no need to set the output data at every transfer thereof, even in case of transferring a large amount of data, thus enabling the burden imposed on the software to be reduced.

Still further, even in case of transferring a large amount of data with the data transfer circuit of the invention, there is no need to prepare many buffer registers, so that the scale of the hardware resource can be reduced.

Figure 4:
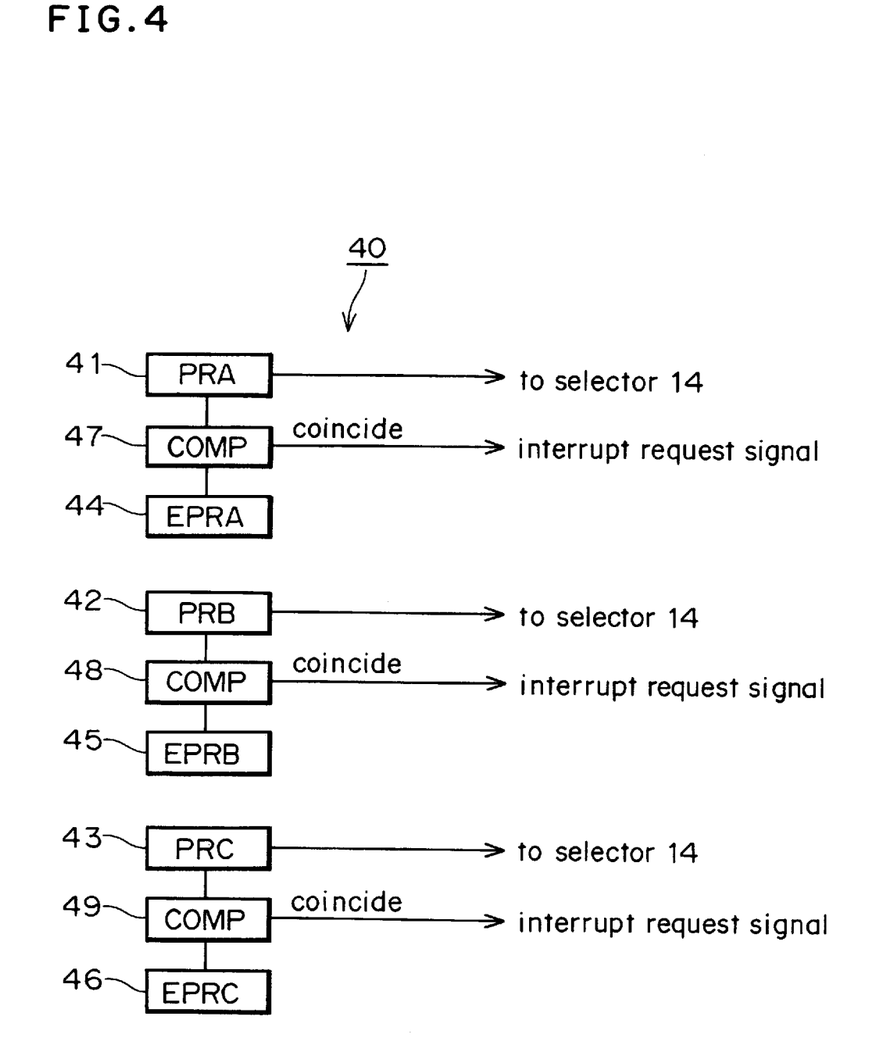
FIG. 4 is a block diagram showing a pointing register exclusively used for a defined peripheral portion in a data transfer circuit according to the third embodiment of the invention.

FIG. 4 is a diagram showing in part the arrangement of a data transfer circuit according to the third embodiment of the invention. In the example shown in this figure, it is assumed that the data transfer circuit is applied to the case where there are provided three peripheral function portions A, B, and C. In the embodiment of FIG. 4, the exclusive pointing register portion shown in FIGS. 2 and 3 are additionally provided with an exclusive end pointing register and a coincidence circuit.

Referring to FIG. 4, an exclusive register 40 includes exclusive pointing registers (PRA, PRB, PRC) 41 through 43 of which each designates the address for storing the contents of the operation result register 12 to the RAM 20 or the leading address of the ROM or RAM 38 storing the output data one after another, exclusive end pointing registers (EPRA, EPRB, EPRC) 44 through 46 of which each stores the ending address for ROM or RAM access termination, and coincidence circuits (COMP) 47 through 49 as means for comparison, of which each compares exclusive pointing registers (PRA, PRB, PRC) 41 through 43 with exclusive end pointing registers EPRA, EPRB, EPRC) 44 through 46 and outputs the interrupt request signal if coincidence is affirmed therebetween.

Now, in the following, there will be explained the operation of the exclusive register 40 as arranged above in the data transfer circuit. In this instance, it is assumed for the peripheral function A to operate continuously.

During the operation, the coincidence circuit (COMP) 47 always compares the output from the exclusive pointing register (PRA) 41 with the output from the exclusive end pointing register (EPRA) 44 storing the ending address for ROM or RAM access termination. In this case, the exclusive pointing register PRA) 41 is arranged as a counter circuit which is incremented at every finish of its one round operation.

When the exclusive pointing register (PRA) 41 is incremented in the continuous operation and its output is coincided with the output from the exclusive end pointing register (EPRA) 44, the coincidence circuit (COMP) 47 outputs the interrupt request signal to the processor.

As explained above, in the data transfer circuit according to the third embodiment of the invention, as exclusive pointing registers (PRA, PRB, PRC) 41 through 43 are additionally provided with exclusive end pointing registers (EPRA, EPRB, EPRC) 44 through 46 and coincidence circuits (COMP) 47 through 49, it can be prevented to gain access to the area other than that which is defined as the exclusive ROM or RAM area.

As has been described in the above, in the embodiments according to the invention, the interrupt request signal is not outputted at every finish of one round operation of the peripheral function, but outputted at the time when a series of operations of the peripheral function is completed. Accordingly, the data processing operation in the first embodiment and the renewal of the output data in the second embodiment can be carried out by executing only a single interrupt operation during a series of data processing operation. Therefore, the operational efficiency of the CPU is highly enhanced and a large amount of data can be treated in lump or in the form of a plurality of data bundles.

The data transfer circuit according to the invention has been discussed so far by way of preferred embodiments with reference to the accompanying drawings. It should be noted, however, that the present invention is not to be limited to these preferred embodiments just shown as examples. It is apparent for persons skilled in the art of this field to device a variety of changes and modifications within the scope of the technical thought as recited in the claims for patent attached hereto. Accordingly, it should be understood that these changes and modifications naturally fall in the technical scope of the invention.

For instance, in the respective embodiments as shown in the above, the exclusive pointing register is arranged to increment after termination of the operation. This is because the exclusive pointing register is formed as an up-counter circuit. However, there is no problem for the exclusive pointing register to be arranged in the form of a down-counter circuit. In this case, the exclusive pointing register is decremented after termination of the operation of the peripheral function.

Furthermore, in the respective embodiments as described above, any kind of memory can be used if it can gain access to the data. For instance, a DRAM is usable. It may be possible to use an electrically erasable programmable read-only memory (EEPROM), a flash memory, etc. as a memory for storing a program. Any processor may be used if it can execute a program.

Still further, registers, selectors, and gate circuits, which constitute the data transfer circuit of the invention, should not be limited as to their number to be used, their sorts, the way of connecting them.

As has been disclosed hereinabove, the data transfer circuit according to the invention is provided with the exclusive pointing register which designates the memory address for storing the operation result accomplished by the defined peripheral function portion to the memory, and the exclusive end pointing register which designates the ending address of the exclusive pointing register, so that the operational efficiency of the CPU can be enhanced and the scale of the hardware can be reduced. Furthermore, the operation result accomplished by the peripheral device can be simply transferred to RAM without carrying out the interrupt operation, so that there is no need for the current program address and various registers to be saved in the stack area. Thus, the significant processing can be speedily executed giving the priority thereto.

The data transfer circuit according to the invention is provided with the exclusive pointing register which designates the leading address of the memory storing the subsequent output data, and the exclusive end pointing register which designates the ending address of the exclusive pointing register, so that even in case of transferring a large amount of data, there is no need for the output data to be set at every transfer of data, thus enabling the burden imposed on the software to be decreased. Furthermore, there is no need for many buffer registers to be prepared, thus enabling the scale of the hardware to be reduced.

In the data transfer circuit according to the invention, there is provided a comparison means which compares the output from the exclusive pointing register with the output from the exclusive end pointing register, and when the coincidence of these outputs is affirmed by the comparison means, the interrupt request signal is outputted to the processor. Accordingly, the renewal of the output data can be completed by only one interrupt operation during a series of operation, thus the operational efficiency of the CPU being further enhanced and enabling a large amount of data to be treated as one or plural data bundle.

The entire disclosure of Japanese Patent Application No. 8-347964 filed on Dec. 26, 1996 including specification, claims, drawings and summary is incorporated herein by reference in its entirety.

What is claimed is:

1. A data transfer circuit comprising:

a memory for storing data;

a processor for gaining access to said memory;

a peripheral function portion for processing peripheral function of said processor;

an exclusive pointing register which designates an address in said memory for storing the contents of an operation result accomplished by said peripheral function portion; and an exclusive end pointing register which designates an ending address of the memory address which stores the contents of the operation result accomplished by said peripheral function portion.

2. A data transfer circuit as claimed in claim 1, wherein there is further provided a comparator which compares a first output from said exclusive pointing register with a second output from said exclusive end pointing register, and outputs an interrupt request signal to the processor when a coincidence between said first and second outputs is affirmed.

3. A data transfer circuit comprising:

a memory for storing data;

a processor for gaining access to said memory;

a peripheral function portion for processing peripheral function of said processor; and an exclusive pointing register which designates an address in said memory for storing the contents of an operation result accomplished by said peripheral function portion;

wherein said exclusive pointing register is arranged as a counter circuit which is incremented or decremented at every termination of an operation of said exclusive pointing register.

4. A data transfer circuit comprising:

a memory for storing data;

a processor gaining access to said memory;

a peripheral function portion for processing a peripheral function of said processor; and an exclusive pointing register which designates a leading address of output data stored in said memory;

wherein said exclusive pointing register is arranged as a counter circuit which is incremented or decremented at every termination of an operation of said exclusive pointing register.

5. A transfer circuit comprising:

a memory for storing data;

a processor gaining access to said memory;

a peripheral function portion for processing a peripheral function of said processor; and an exclusive pointing register which designates an address in said memory for storing contents of an operation result accomplished by said peripheral function portion; and an operation result register which holds the operation result accomplished by said peripheral function portion.

6. A data transfer circuit as claimed in claim 5, wherein said operation result register writes data to said address of said memory which is designated by said exclusive pointing register in response to a signal indicating termination of an operation in said peripheral function portion.

7. A data transfer circuit as claimed in claim 5, wherein said exclusive pointing register and said operation result register are each provided in a number which is at least a one-to-one correspondence to a number of said peripheral function portion.

8. A data transfer circuit as claimed in claim 7, wherein there are further provided an exclusive pointing register in correspondence with said peripheral function portion which transfers data to said memory, and a selector for use in selection of said output operation result register.

9. A data transfer circuit as claimed in claim 5, wherein said exclusive pointing register is arranged as a counter circuit which is incremented or decremented at every termination of an operation of said exclusive pointing register.

10. A data transfer circuit as claimed in claim 5, wherein said memory is a RAM which enables random access of the data stored therein.

11. A transfer circuit comprising:
a memory for storing data;
a processor gaining access to said memory;
a peripheral function portion for processing a peripheral function of said processor; and
an exclusive pointing register which designates an address in said memory for storing contents of an operation result accomplished by said peripheral function portion; and
an output register which temporarily holds output data designated and read out by said exclusive pointing register.

12. A data transfer circuit as claimed in claim 11, wherein said output register is provided with a buffer register which temporarily holds an output of said output register.

13. A data transfer circuit as claimed in claim 11, wherein said output register reads out the data from said address of said memory designated by said exclusive pointing register, in response to the signal indicating termination of an operation of said peripheral function portion.

14. A data transfer circuit as claimed in claim 13, wherein said buffer register reads out the data from said address of said memory designated by said exclusive pointing register, in response to the signal indicating termination of an operation of said peripheral function portion.

15. A data transfer circuit as claimed in claim 11, wherein said exclusive pointing register and said output register are each provided in a number which is at least a one-to-one correspondence to a number of said peripheral function portion.

16. A data transfer circuit as claimed in claim 11, wherein there are further provided an exclusive pointing register in correspondence with said peripheral function portion which transfers the data to said memory, and a selector which selects said output register.

17. A data transfer circuit as claimed in claim 11, where there is further provided an exclusive end pointing register which designates an ending address of said exclusive pointing register.

18. A data transfer circuit as claimed in claim 17, wherein there is further provided a comparator which compares a first output from said exclusive pointing register with a second output from said exclusive end pointing register, and which outputs an interrupt request signal to the processor when a coincidence between said first and second outputs is affirmed.

19. A data transfer circuit as claimed in claim 11, wherein said exclusive pointing register is arranged as a counter circuit which is incremented or decremented at every termination of an operation of said exclusive pointing register.

20. A data transfer circuit as claimed in claim 11, wherein said memory is a ROM which stores a program or a RAM which enables random access of the data stored therein.

* * * * *